(12) United States Patent
Inaba et al.

(10) Patent No.: US 7,813,708 B2
(45) Date of Patent: Oct. 12, 2010

(54) TUNER MODULE

(75) Inventors: Toshihiko Inaba, Akita (JP); Takumi Suzuki, Akita (JP); Shozo Miyamoto, Akita (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 598 days.

(21) Appl. No.: 11/829,294

(22) Filed: Jul. 27, 2007

(65) Prior Publication Data

US 2008/0070529 A1 Mar. 20, 2008

(30) Foreign Application Priority Data

Sep. 19, 2006 (JP) ............................ P2006-252119

(51) Int. Cl.
*H04B 1/18* (2006.01)
*H04K 3/00* (2006.01)
(52) U.S. Cl. ...................... 455/193.1; 455/90.3; 334/85
(58) Field of Classification Search ................ 455/90.3, 455/193.1, 347–349; 334/85; 343/702
See application file for complete search history.

(56) References Cited

U.S. PATENT DOCUMENTS

| 7,113,061 B2 * | 9/2006 | Ootori et al. ................... 334/85 |
| 2007/0057857 A1 * | 3/2007 | Fifield ......................... 343/702 |

FOREIGN PATENT DOCUMENTS

| JP | 6-209268 | 7/1994 |
| JP | 2002-344335 | 11/2002 |

* cited by examiner

*Primary Examiner*—Lee Nguyen
(74) *Attorney, Agent, or Firm*—Whitham Curtis Christofferson & Cook, PC

(57) ABSTRACT

An RF input portion is formed on a printed circuit board and is operable to input a high-frequency signal received by an antenna device. An electronic component is mounted on the printed circuit and is operable to process the input high-frequency signal. The RF input portion has a specific pattern adapted to be electrically interchangeably connectable with a plurality of types of connections.

5 Claims, 8 Drawing Sheets

TUNER MODULE

The disclosure of Japanese Patent Application No. 2006-252119 filed Sep. 19, 2006 including specification, drawings and claims is incorporated herein by reference in its entirety.

BACKGROUND

The present invention relates to a tuner module for a radio receiver, and more particularly, to a tuner module suitable for an in-vehicle digital radio receiver for receiving an electric wave (hereinafter, referred to as "satellite wave") from a satellite or an electric wave (hereinafter, referred to as "terrestrial wave") from an earth station to provide digital radio broadcasting.

Recently, a digital radio receiver receiving the satellite wave or the terrestrial wave from the SDARS satellite to provide digital radio broadcasting has been developed and put in practical use in the United States. The digital radio receiver is generally mounted in a mobile object such as an automobile, receives the electric wave in the frequency band of about 2.3 GHz, and provides the radio broadcasting. That is, the digital radio receiver is a radio receiver capable of providing the mobile broadcasting. Since the frequency of the reception electric wave is about 2.3 GHz, the reception wavelength (resonance wavelength) λ at that time is about 128.3 mm. The terrestrial wave is formed in the manner that the satellite wave is received by an earth station, the frequency of the received satellite wave is slightly shifted, and the wave is re-sent in a linearly-polarized wave. That is, the satellite wave is a circular-polarized wave, but the terrestrial wave is the linearly-polarized wave.

Since the electric wave in the frequency band of about 2.3 GHz is used in such digital radio broadcasting, an antenna receiving the electric wave is required to be installed outdoors. Accordingly, when the digital radio receiver is mounted in an automobile, the antenna of the digital radio receiver is required to be installed on the roof of the automobile. Such an automobile antenna and a receiver body (head unit) installed in the interior of the automobile are electrically connected to each other through a cable. The head unit serves as an external device.

A system for receiving this kind of the satellite wave or the terrestrial wave includes an antenna unit (antenna device) and a tuner unit (satellite radio tuner). The antenna unit (antenna device) receives the satellite wave or the terrestrial wave and then outputs a reception signal with high frequency. The tuner unit (satellite radio tuner) demodulates the reception signal and then outputs a sound signal.

Electronic components constituting such a tuner are mounted on a printed circuit board and housed in a metal case as a shield (e.g., see Japanese Patent Publication No. 06-209268A).

A related-art satellite digital radio receiver will be described with reference to FIG. 8. The satellite digital radio receiver includes an antenna 101, a tuner unit 102, a signal demodulating unit 103, a channel demodulating unit 104, a sound decoder 105, a data decoder 106, a control unit 107, and an operation unit 108 (e.g., see Japanese Patent Publication No. 2002-344335).

As described above, the electronic components constituting the tuner are mounted on the printed circuit board. In the printed circuit board, an RF input portion for inputting the reception signal with high frequency (RF) received by the antenna device is formed. There are a first case where the reception signal is inputted to the printed circuit board through a coaxial cable and a second case where the reception signal is inputted to the printed circuit board through an RF connector, in accordance with customer's desire. In the first case, the front end of the coaxial cable is soldered to the RF input portion. In the second case, the front end of the RF connector is directly connected to the RF input portion. To cope with these kinds of cases, in the related-art printed circuit board for a tuner, a pattern of the RF input portion is changed for the first and second cases. In other words, in the related-art printed circuit board for a tuner, there are arranged two kinds: a printed circuit board having an RF input portion for attaching the coaxial cable; and a printed circuit board having an RF input portion for directly attaching the RF connector.

For this reason, in the related-art printed circuit board for a tuner, there are problems that the number of design processes increases, and thus the cost of manufacturing the printed circuit board increases.

SUMMARY

It is therefore an object of the invention to provide a tuner module including a printed circuit board capable of decreasing the number of design processes.

It is another object of the invention to provide a tuner module including a printed circuit board capable of decreasing the cost.

In order to achieve the above objects, according to an aspect of the invention, there is provided a tuner module comprising:

a printed circuit board;

an RF input portion formed on the printed circuit board and operable to input a high-frequency signal received by an antenna device;

an electronic component mounted on the printed circuit and operable to process the input high-frequency signal;

wherein the RF input portion has a specific pattern adapted to be electrically interchangeably connectable with a plurality of types of connections.

The types of connections may include a coaxial cable and an RF connector.

The specific pattern may include a first pattern adapted to be electrically connectable with the coaxial cable having a central conductor and an outer conductor, and a second pattern adapted to be electrically connectable with the RF connector having a signal pin and a ground pin.

The first pattern may include a signal soldering pattern adapted to solder the central conductor, and a ground soldering pattern adapted to solder the outer conductor.

The second pattern may include a signal pin insertion hole adapted to insert the signal pin thereto, and a ground pin insertion hole adapted to insert the ground pin thereto.

The tuner module may further comprise a metal case comprised of aluminum and accommodating the printed circuit board therein.

The metal case may include a pair of die-cast cases between which the printed circuit board is interposed.

The electric component may be operable to demodulate the input high-frequency signal and output the demodulated signal which is a sound signal.

According to another aspect of the invention, there is provided an in-vehicle digital radio receiver having the above described tuner module.

In the present invention, since the specific pattern adapted to be electrically interchangeably connectable with the types of connections are formed as the RF input portion, the same printed circuit board is capable of coping with the coaxial cable and the RF connector. For this reason, the number of design processes can decrease and the cost of the board can decrease.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE EMBODIMENTS

Hereinafter, an embodiment of the invention will be described in detail with reference to the drawings.

Figure 1:
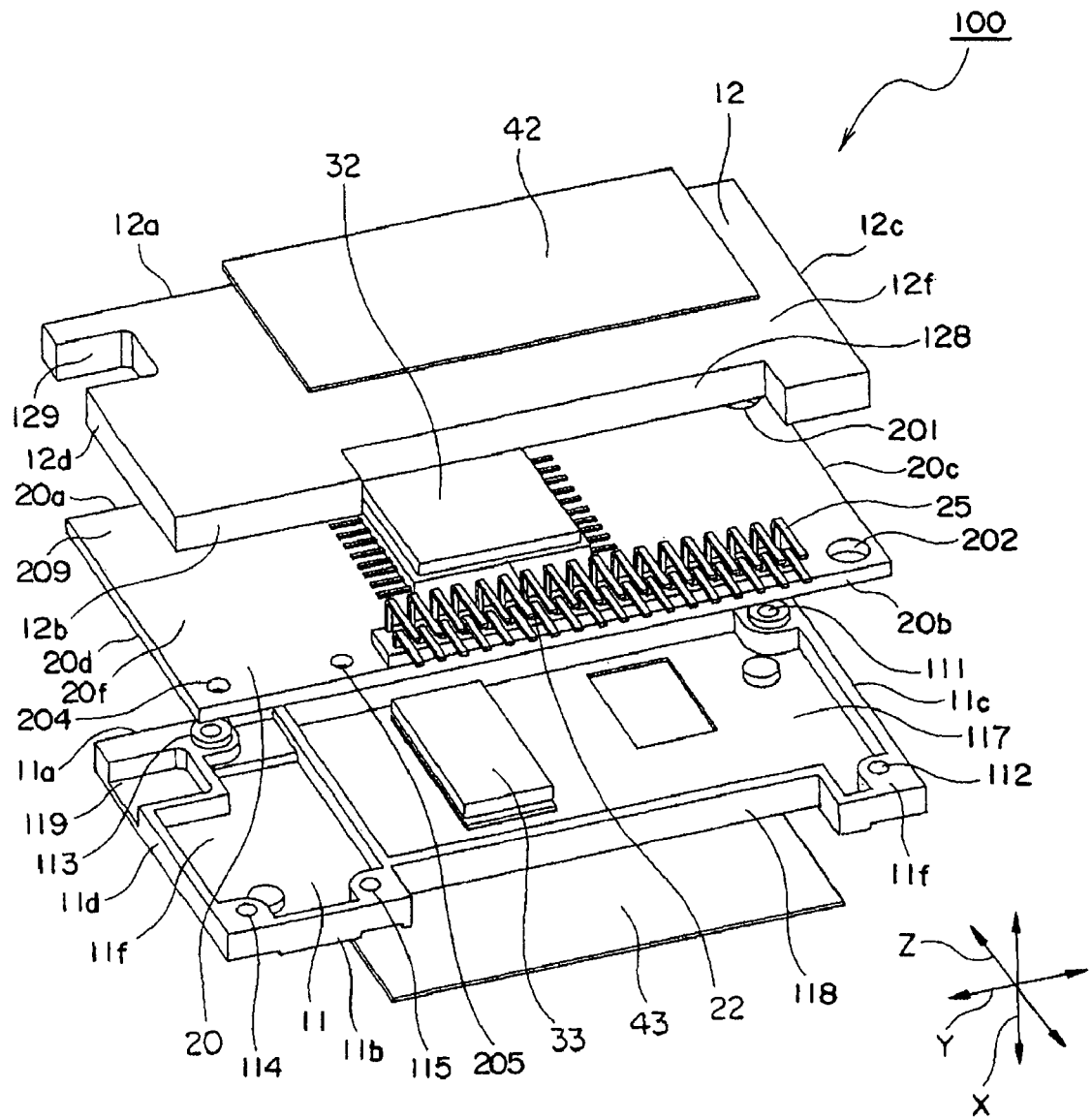
FIG. 1 is a schematic perspective view illustrating a tuner module to which the present invention is applied in an in-vehicle digital radio receiver.
Figure 2:
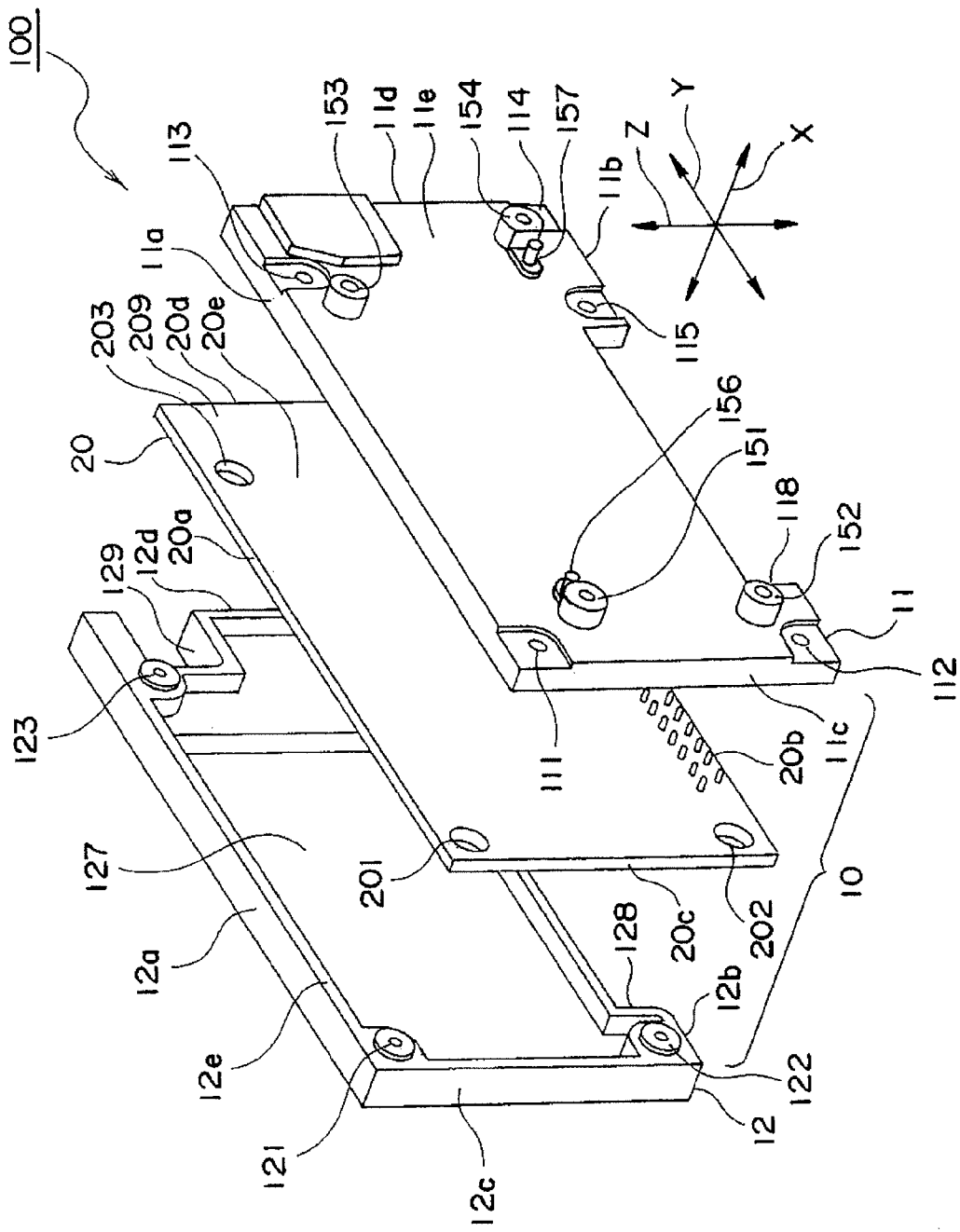
FIG. 2 is a schematic perspective view illustrating the tuner module shown in FIG. 1.
Figure 3:
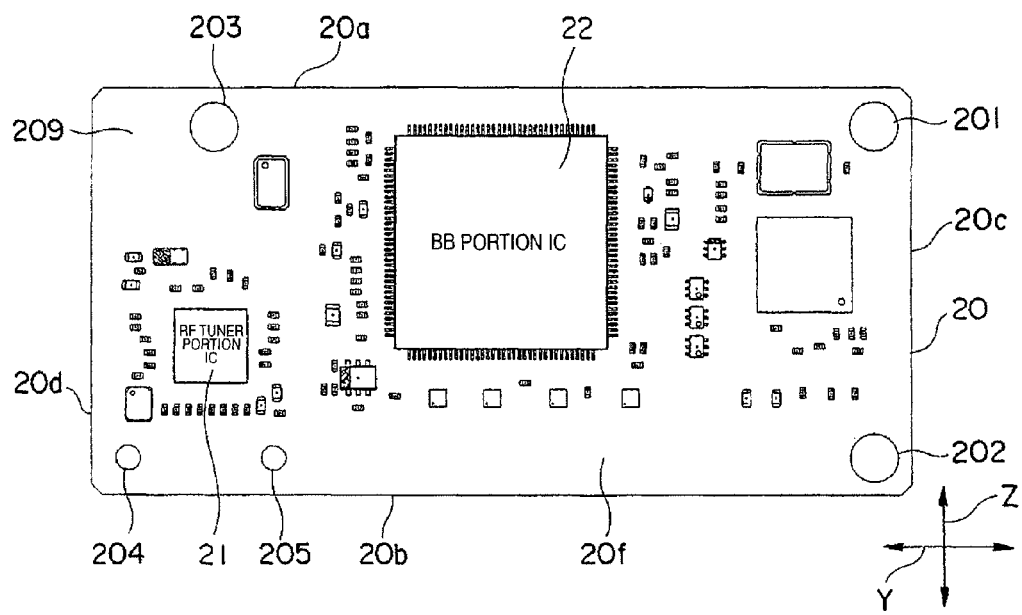
FIG. 3(a) is a rear view showing a rear surface side of a printed circuit board on which electronic components constituting the tuner module shown in FIG. 1 are mounted.
FIG. 3(b) is a front view showing a front surface side of the printed circuit board on which electronic components constituting the tuner module shown in FIG. 1 are mounted.
Figure 3:
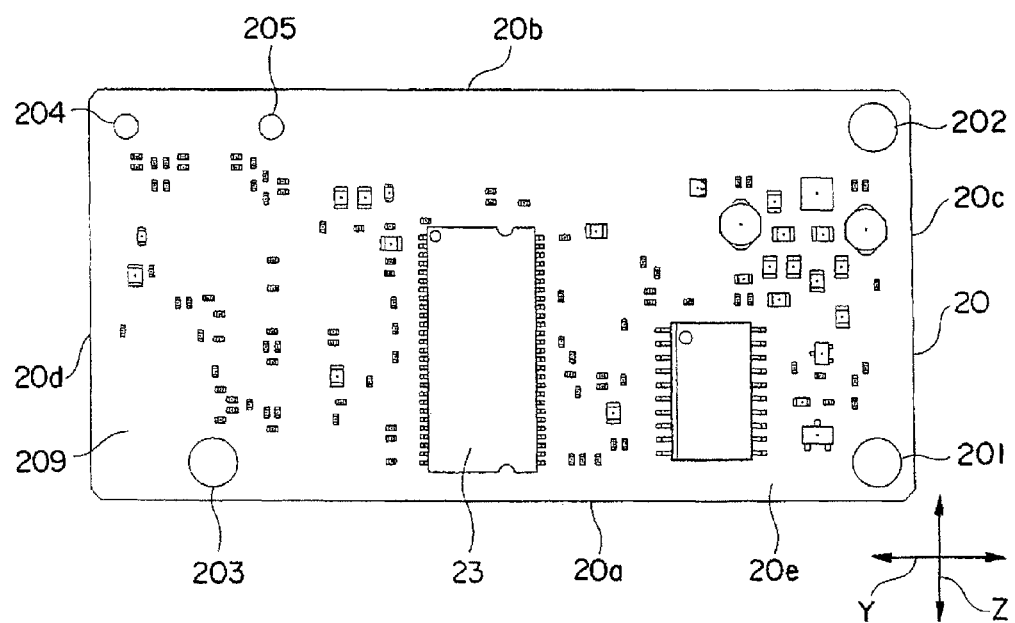

First, a tuner module 100 according to the embodiment of the invention will be described with reference to FIGS. 1 to 3. In FIGS. 1 to 3, an X-direction denotes a front-rear direction (depth direction, thickness direction), a Y-direction denotes a right-left direction (transverse direction, width direction), and a Z-direction denotes an upper-lower direction (height direction). The tuner module 100 is transversely installed on a main surface of a main board (where an example of transverse installation is shown). However, the invention is applicable to a case where the tuner module is longitudinally installed (face-down mount) on the main surface of the main board.

FIGS. 2 and 3 show a case where a tuner unit, a demodulation unit, a sound decoder unit, a data decoder unit, and a controller for controlling them among constituent elements of a vehicle digital radio receiver are mounted on one printed circuit board, which is accommodated in a metal case. Such a configuration is referred to as a tuner module.

In FIG. 2, the tuner module 100 includes a metal case 10 and a printed circuit board 20. The metal case 10 includes a front case 11 and a rear case 12 which are made of aluminum by the use of a die-casting method. When the tuner module 100 is transversely installed, the front case 11 is used as a lower case and the rear case 12 is used as an upper case. In this case, a method of arranging connector pins (described below) mounted on the printed circuit board 20 is various.

The front case 11 has a rectangular parallelepiped shape extending substantially parallel with a Y-Z plane defined as the right-left direction Y and the upper-lower direction Z. The front case 11 has an upper side 11a and a lower side 11b opposed to each other in the upper-lower direction Z, and a left side 11c and a right side 11d opposed to each other in the right-left direction Y. The front case 11 has a front surface 11e and a rear surface 11f opposed to each other in the front-rear direction X.

Similarly, the rear case 12 has a rectangular parallelepiped shape extending substantially parallel with a Y-Z plane defined as the right-left direction Y and the upper-lower direction Z. The rear case 12 has an upper side 12a and a lower side 12b opposed to each other in the upper-lower direction Z, and a left side 12c and a right side 12d opposed to each other in the right-left direction Y. The rear case 12 has a front surface 12e and a rear surface 12f opposed to each other in the front-rear direction X.

The printed circuit board 20 has a substantially rectangular plate shape extending parallel with a Y-Z plane defined as the right-left direction Y and the upper-lower direction Z. The printed circuit board 20 has an upper side 20a and a lower side 20b opposed to each other in the upper-lower direction Z, and a left side 20c and a right side 20d opposed to each other in the right-left direction Y. The printed circuit board 20 has a front surface 20e and a rear surface 20f opposed to each other in the front-rear direction X. The front case 11 is disposed close to the front surface 20e of the printed circuit board 20 and the rear case 12 is disposed close to the rear surface 20.

The printed circuit board 20 is accommodated in a space defined between the front case 11 and the rear case 12 other than portions required to be electrically connected to the exterior (described below) and thus a shield is realized. That is, the printed circuit board 20 is fixed using first to fifth substrate fixing screws (described below) in a state where the printed circuit board 20 is interposed between the front case 11 and the rear case 12.

The front case 11 has first to fifth front screw holes 111, 112, 113, 114, and 115 to which the first to fifth substrate fixing screws are fitted, respectively. The first front screw hole 111 is provided at the left-upper corner portion of the front case 11. The second front screw hole 112 is provided at the left-lower corner portion of the front case 11. The third front screw hole 113 is provided at the upper side 11a close to the right side 11d of the front case 11. The fourth front screw hole 114 is provided at the right-lower corner portion of the front case 11. The fifth front screw hole 115 is provided at the lower side 11b more inside than the fourth screw hole 114 does.

The rear case 12 has a first rear screw boss portion 121 in which a screw hole for fitting the first substrate fixing screw is formed at a position corresponding to the first front screw hole 111. The rear case 12 has a second rear screw boss portion 122 in which a screw hole for fitting the second substrate fixing screw is formed at a position corresponding to the second front screw hole 112. In addition, the rear case 12 has a third rear screw boss portion 123 in which a screw hole for fitting the third substrate fixing screw is formed at a position corresponding to the third front screw hole 113. Although not shown, the rear case 12 has fourth and fifth rear screw holes for fitting the fourth and fifth substrate fixing screws at positions corresponding to the fourth and fifth front screw holes 114 and 115, respectively.

The printed circuit board 20 has a first hole 201 in which the first rear screw boss portion 121 is inserted at a position corresponding to the first front screw hole 111. The printed circuit board 20 has a second hole 202 in which the second rear screw boss portion 122 is inserted at a position corresponding to the second front screw hole 112. In addition, the printed circuit board 20 has a third hole 203 in which the third rear screw boss portion 123 is inserted at a position corresponding to the third front screw hole 113. Further, the printed circuit board 20 has fourth and fifth holes 204 and 205 through which the fourth and fifth substrate fixing screws pass at positions corresponding to the fourth and fifth front screw holes 114 and 115, respectively.

In FIGS. 3(a) and 3(b), electronic components are mounted on the front surface 20e and the rear surface 20f of the printed circuit board 20. FIG. 3(a) illustrates the rear surface 20f of the printed circuit board 20 and FIG. 3(b) illustrates the front surface 20e of the printed circuit board 20. In FIG. 3(b), the upper and lower of the printed circuit board 20 are reversely shown.

As shown in FIG. 3(a), a first IC part 21 as a main constituent part of the tuner unit and a second IC part 22 as a main constituent part of the demodulating unit are mounted on the rear surface 20f of the printed circuit board 20. In addition, as shown in FIG. 3(b), a third IC part as the main constituent part of the controller is mounted on the front surface 20e of the printed circuit board 20.

AS shown in FIG. 1, a recess portion 117 corresponding to the sizes of electronic components or electronic component groups (in a case where a plurality of the electronic components are disposed close to each other) mounted on the printed circuit board 20 is formed on the rear surface (inner wall surface) 11f of the front case 11 coming in contact with the front surface 20e of the printed circuit board 20. Similarly, as shown in FIG. 2, a recess portion 127 corresponding to the sizes of electronic components or electronic component groups (in a case where a plurality of the electronic components are disposed close to each other) mounted on the printed circuit board 20 is formed on the front surface (inner wall surface) 12e of the rear case 12 coming in contact with the rear surface 20f of the printed circuit board 20. Although the recess portions are formed in order to reduce the thickness of the tuner module 100 as small as possible, a conductive pattern formed on the printed circuit board 20 and a component in which a problem occurs due to a short-circuit does not come in contact with the metal case 10 or is insulated.

As shown in FIG. 1, heat-conductive sheets 32 is adhered to the upper surfaces (in this case, the whole surface) of the second and third IC parts 22 and 23 among the first to third IC parts 21 to 23. In addition, heat-conductive sheets 33 is adhered to the inner surfaces (the front surface 12e of the rear case 12 and the rear surface 12f of the front case 11) of the metal case 10 corresponding to the uppers surfaces. In order to improve the heat conduction, the heat-conductive sheets 32 and 33 bring the second IC part 22 in close contact with the front surface (inner surface) 12e of the rear case 12 and bring the third IC part 23 in close contact with the rear surface 11f (inner surface) of the front case 11, respectively. The heat-conductive sheet may be made of, for example, silicon rubber, acryl rubber, graphite, or the like.

In the outer surface of the metal case 10, that is, to the rear surface (outer surface) 12f of the rear case 12 and to the front surface (outer surface) 11e of the front case 11, heat radiating sheets 42 and 43 are adhered to the areas including the areas corresponding to the heat-conductive sheets 32 and 33. The adhered areas of the heat radiating sheets 42 and 43 preferably include the adhered areas of the heat-conductive sheets 32 and 33, but may exclude the areas. The heat radiating sheet may be made of, for example, mixture of liquid ceramic and glass cloth.

With such a configuration, since the heat-conductive sheets 32 and 33 and the heat radiating sheets 42 and 43 are all thin, the total size of the tuner module 100, particularly, the size in the thickness direction X does not increase. The heats generated from the second and third IC parts 22 and 23 are conducted to the rear case 12 and the front case 11 through the heat-conductive sheets 32 and 33. The rear case 12 and the front case 11 are made of aluminum by the use of a die-casting method with high heat-conductivity, that is, good heat radiation effect. In addition, since the heat radiating sheets 42 and 43 are adhered to the outer surface of the metal case 10, the heat radiation performance is further improved. According to a heat radiation test, it was confirmed that the temperature of the tuner module shown in FIG. 1 decreased by about 10° C. in comparison with a case where the heat-conductive sheets and the heat radiating sheet was not provided. Further, in a performance test under the circumference at 85° C., it was confirmed that the tuner module operated normally.

As shown in FIG. 1, connector pins 25 inserted to the main board (not shown) are mounted on the lower side 20b of the printed circuit board 20. In the front case 11, a rectangular front notch portion 118 for a connector is formed on the lower side 11b corresponding to the position where the connector pins 25 are mounted. Similarly, in the rear case 12, a rectangular rear notch portion 128 for the connector is formed on the lower side 12b corresponding to the position where the connector pins 25 are mounted.

In the printed circuit board 20, an RF input portion 209 for inputting a high-frequency (RF) signal received from an antenna device (not shown) is formed at the right-upper corner portion thereof. On the other hand, in the front case 11, a rectangular RF inputting front recess portion 119 is formed on the right side 11d corresponding to the RF input portion 209. Similarly, in the rear case 12, a rectangular rear notch portion 129 is formed on the right side 12d corresponding to the RF input portion 209. The RF input portion 209 has specific patterns capable of coping with the coaxial cable and the RF connector. In other words, the specific patterns are electrically interchangeably connectable with types of connections. The types of connections include the coaxial cable and the RF connector.

In addition, since the tuner module 100 according to the embodiment has the longitudinal shape (longitudinal disposition), the tuner module 100 is held and mounted on the main surface of the main board by a bracket (not shown). The bracket is mounted on the tuner module 100 by first to fourth mounting screws (not shown). The bracket is made of steel or zinc-coating steel plate. For this reason, the bracket can be soldered to the main board unlike the aluminum tuner module 100 including the metal case 10 made of aluminum.

As shown in FIG. 2, on the front surface 11e of the front case 11, first to fourth front screw boss portions 151, 152, 153, and 154 having screw holes for screwing the first to fourth screws protrude forwardly from the front surface 11e. The first to fourth front screw boss portions 151 to 154 are provided in the vicinity of the first to fourth front screw holes 111 to 114, respectively. On the front surface 11e of the front case 11, first and second positioning protrusions 156 and 157 for positioning the bracket protrude forwardly from the front surface 11e. The first positioning protrusion 156 is provided in the vicinity of the first front screw boss portion 151. The second positioning protrusion 157 is provided in the vicinity of the fourth front screw boss portion 154.

Figure 4:
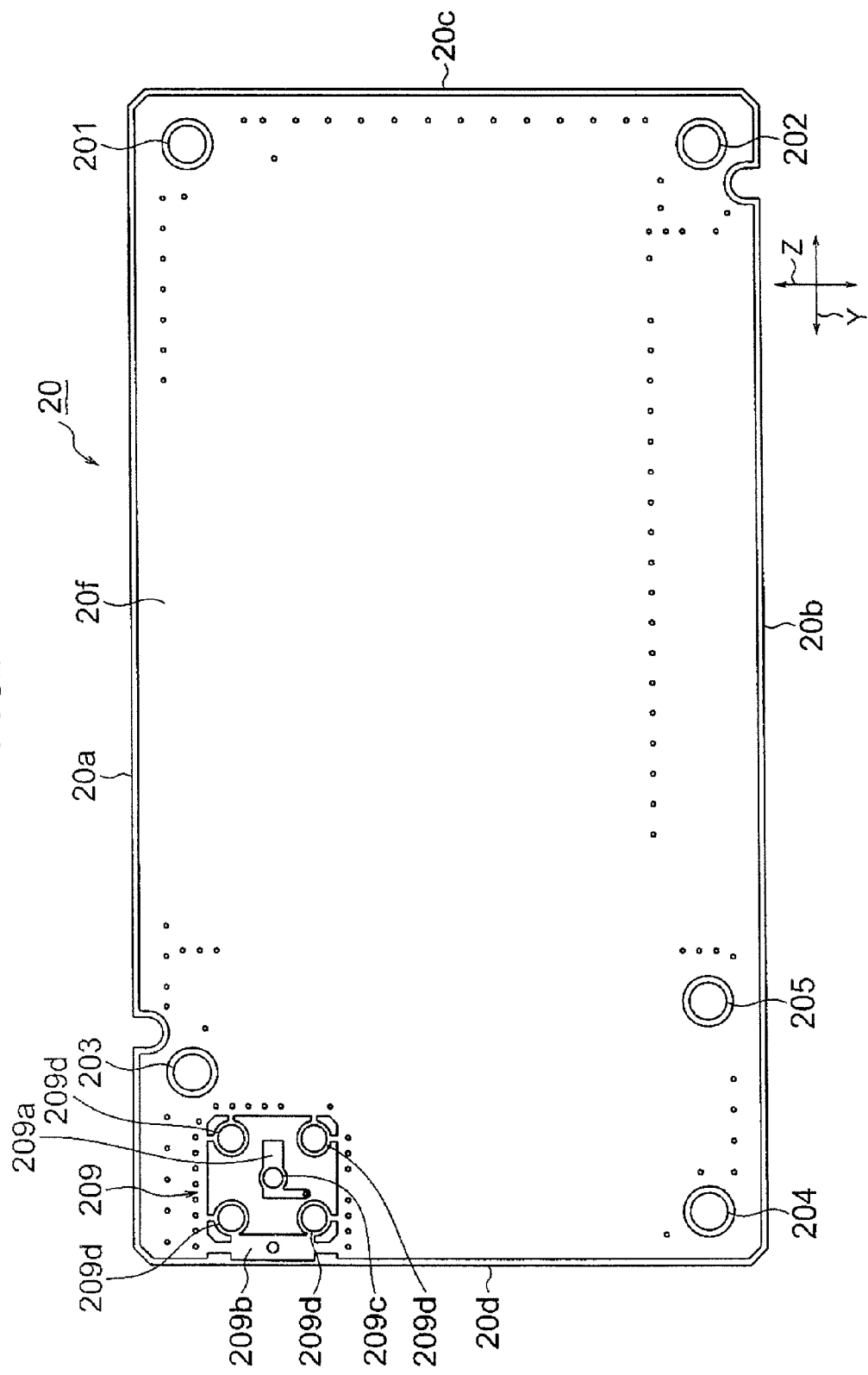
FIG. 4 is a rear view showing the printed circuit board used in the tuner module shown in FIG. 1 according to an embodiment of the invention.

The RF input portion 209 provided on the printed circuit board 20 used in the tuner module 100 will be described with reference to FIG. 4. FIG. 4 is a rear view of the printed circuit board 20. The RF input portion 209 has the specific patterns capable of coping with the coaxial cable 91 and the RF connector 92.

Specifically, the RF input portion 209 includes a signal soldering pattern 209a for the coaxial cable 91 and a ground soldering pattern 209b for the coaxial cable 91, as the specific patterns. The RF input portion 209 further includes a signal pin insertion hole 209c for the RF connector 92 and four ground pin insertion holes 209d for the RF connector 92, as the specific patterns.

Figure 5:
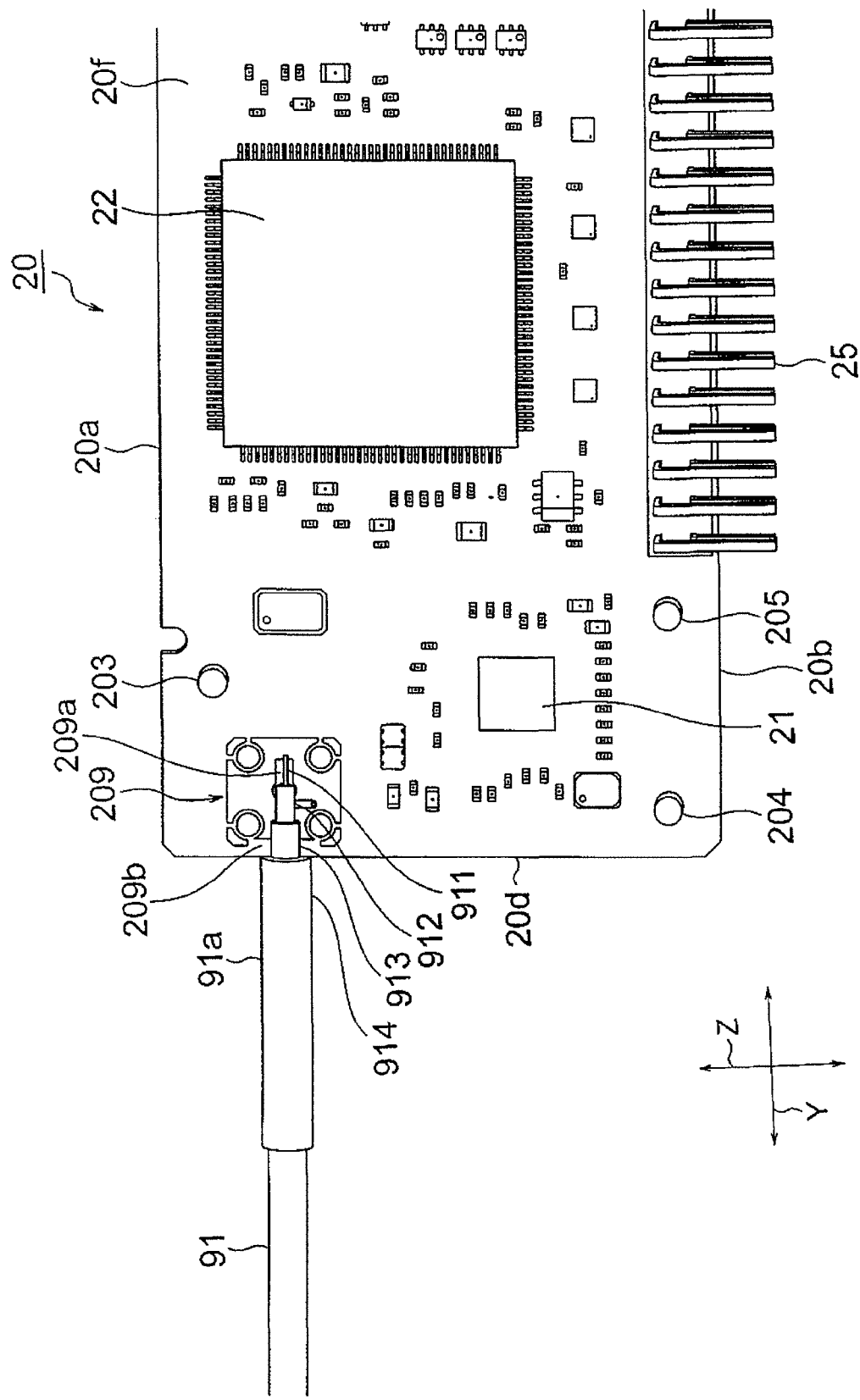
FIG. 5 is a partial perspective view illustrating a state where a front end of a coaxial cable is connected to the printed circuit board shown in FIG. 4 when viewed from the rear surface side of the printed circuit board.

FIG. 5 is a diagram illustrating a state where the front end 91a of the coaxial cable 91 is electrically connected to the RF input portion 209. The coaxial cable 91 includes a central conductor (inner conductor) 911, a cylindrical insulator 912 covering the central conductor 911, a cylindrical outer conductor 913 provided in the outer periphery of the cylindrical insulator 912, and a sheath (outer cover) 914 covering the outer conductor 913.

As shown in FIG. 5, the central conductor 911 of the coaxial cable 91 is electrically connected to the signal soldering pattern 209a of the RF input portion 209 by soldering (not shown). The outer conductor 913 of the coaxial cable 91 is electrically connected to the ground soldering pattern 209b of the RF input portion 209 by soldering (not shown).

Figure 6:
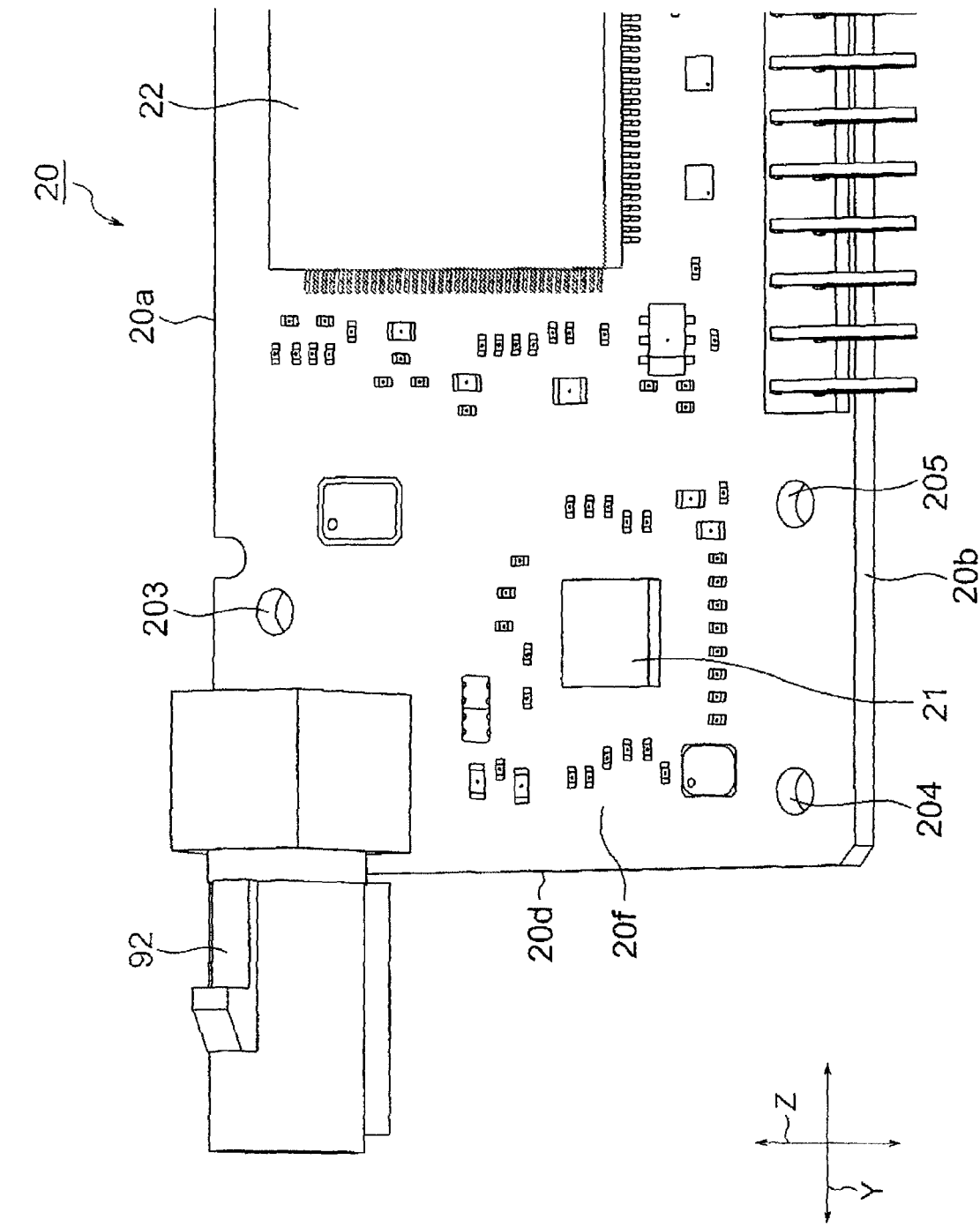
FIG. 6 is a partial perspective view illustrating a state where an RF connector is connected to the printed circuit board shown in FIG. 4 when viewed from the rear surface side of the printed circuit board.
Figure 7:
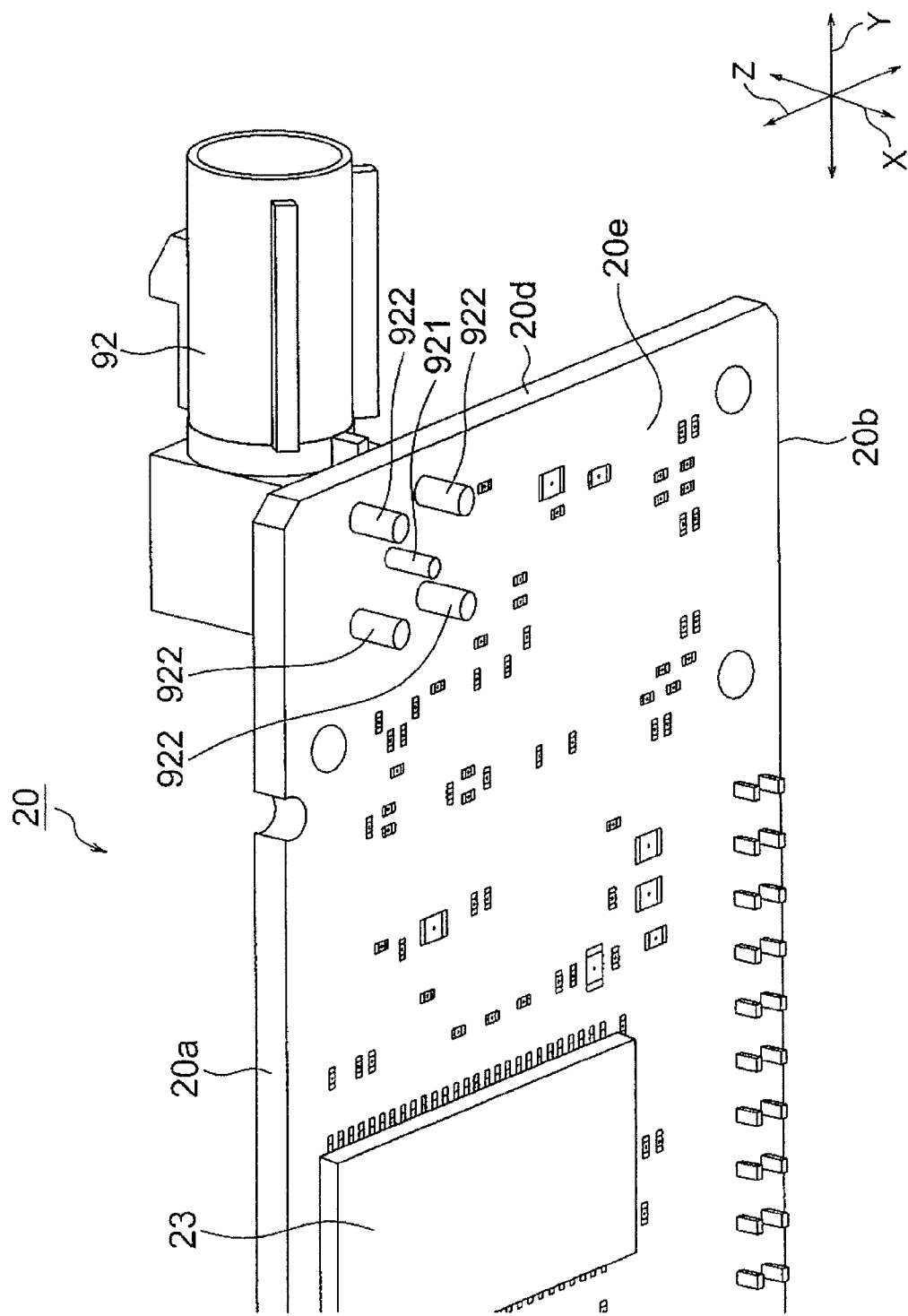
FIG. 7 is a partial perspective view illustrating the state in FIG. 6 when viewed from the front surface side of the printed circuit board.
Figure 8:
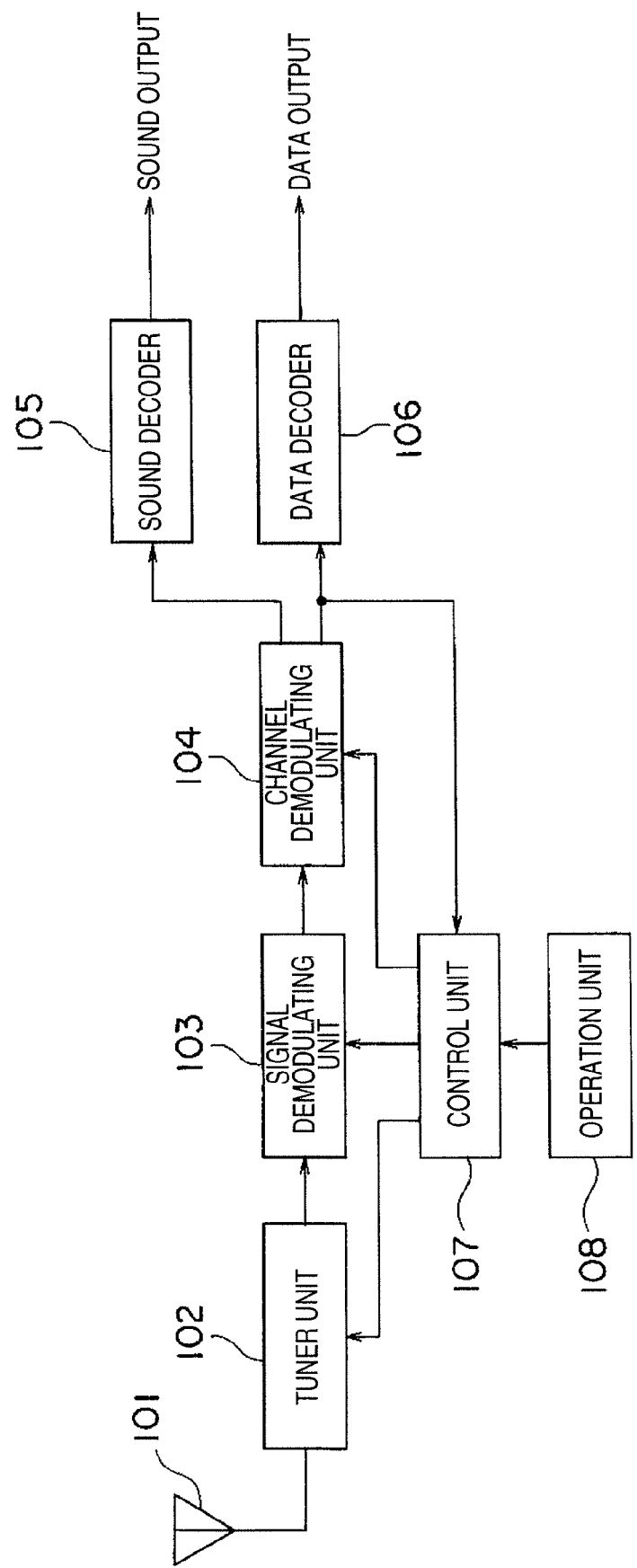
FIG. 8 is a block diagram illustrating a configuration of a satellite digital radio receiver as an example of a digital radio receiver.

FIGS. 6 and 7 are diagrams illustrating a state where the RF connector 92 is electrically connected to the RF input portion 209. FIG. 6 is a perspective view showing the rear surface 20f of the printed circuit board 20 connected to the RF connector 92 when viewed from the rear surface side of the printed circuit board 20. FIG. 7 is a perspective view showing the front surface 20e of the printed circuit board 20 connected to the RF connector 92 when viewed from the front surface side of the printed circuit board 20.

As shown in FIG. 7, the RF connector 92 includes one signal pin 921 protruding from the central portion thereof and four ground pins 922 disposed in the vicinity of the signal pin 921.

The signal pin 921 of the RF connector 92 is inserted into the signal pin insertion hole 209c of the RF input portion 209. The four ground pins 922 of the RF connector 92 are inserted into the four ground pin insertion holes 209d of the RF input portion 209. The signal pin 921, the signal pin insertion hole 209c, the four ground pins 922, and the four ground pin insertion holes 209d are electrically connected to the front surface 20f of the printed circuit board 20 by soldering (not shown).

In the embodiment of the invention as described above, the RF input portion 209 formed on the printed circuit board 20 has the specific patterns capable of soldering in any case of attaching the coaxial cable 91 and directly attaching the RF connector 92. Accordingly, even when any of the coaxial cable 91 and the RF connector 92 is connected, the same printed circuit board 20 is capable of coping with the case. For this reason, the number of design processes can be reduced and the cost of manufacturing the printed circuit board can be reduced.

In this embodiment, when the coaxial cable 91 is electrically connected to the specific patterns of the RF input portion 209, the RF connector 92 cannot be connected to the specific patterns. On the other hand, when the RF connector 92 is connected to the specific patterns of the RF input portion 209, the coaxial cable 91 cannot be connected to the specific patterns. Namely, the specific patterns are interchangeably connectable with the coaxial cable 91 and the RF connector 92.

Although the preferred embodiment of the invention has been described above, the invention is not limited to the above-described embodiment. For example, in the embodiment, the printed circuit board is received in the metal case including the front case and the rear case, but such a metal case may be not provided.

Although the invention is suitable for a tuner module in a vehicle digital radio receiver required to decrease in size, the invention is applicable to the whole radio receiver having a type in which both of coaxial cable and an RF connector are connected to a printed circuit board.

What is claimed is:

1. A tuner module comprising:
   a printed circuit board;
   an RF input portion formed on the printed circuit board and operable to input a high-frequency signal received by an antenna device;
   an electronic component mounted on the printed circuit and operable to process the input high-frequency signal;
   wherein the RF input portion has a specific pattern adapted to be electrically interchangeably connectable with a plurality of types of connections;
   wherein the types of connections includes a coaxial cable and an RF connector; and
   wherein the specific pattern includes a first pattern adapted to be electrically connectable with the coaxial cable having a central conductor and an outer conductor, and a second pattern adapted to be electrically connectable with the RF connector having a signal pin and a ground pin;
   the first pattern includes a signal soldering pattern adapted to solder the central conductor, and a ground soldering pattern adapted to solder the outer conductor; and
   the second pattern includes a signal pin insertion hole, adapted to insert the signal pin thereto, and a ground pin insertion hole adapted to insert the ground pin thereto.

2. The tuner module as set forth in claim 1, further comprising a metal case comprised of aluminum and accommodating the printed circuit board therein.

3. The tuner module as set forth in claim 2, wherein the metal case includes a pair of die-cast cases between which the printed circuit board is interposed.

4. The tuner module as set forth in claim 1, wherein the electric component is operable to demodulate the input high-frequency signal and output the demodulated signal which is a sound signal.

5. An in-vehicle digital radio receiver having the tuner module as set forth in claim 1.

* * * * *